(12) United States Patent
Wang et al.

(10) Patent No.: US 6,650,159 B2
(45) Date of Patent: Nov. 18, 2003

(54) METHOD AND APPARATUS FOR PRECISE SIGNAL INTERPOLATION

(75) Inventors: Eddie Wang, Saratoga, CA (US); Harry Muljono, Union City, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/112,638

(22) Filed: Mar. 29, 2002

(65) Prior Publication Data

US 2003/0184356 A1 Oct. 2, 2003

(51) Int. Cl.[7] .................................................. H03K 3/00
(52) U.S. Cl. ...................... 327/258; 327/270; 327/272
(58) Field of Search ................................ 327/270, 231, 327/256, 257, 258, 259, 261, 112, 108, 272; 326/86, 93, 95

(56) References Cited

U.S. PATENT DOCUMENTS 5,489,864 A * 2/1996 Ashuri ........................ 327/161
5,621,739 A    4/1997 Sine et al. ................... 371/22.1
6,121,808 A * 9/2000 Gaudet ......................... 327/231
6,348,826 B1 * 2/2002 Mooney et al. .............. 327/270
2001/0045853 A1 * 11/2001 Saeki ........................... 327/233

OTHER PUBLICATIONS

John G. Maneatis, "Low–Jitter Process–Independent DLL and PLL Based on Self–Biased Techniques", 1996 IEEE, pp. 1723–1732.

* cited by examiner

Primary Examiner—Timothy P. Callahan
Assistant Examiner—Linh Nguyen
(74) Attorney, Agent, or Firm—Cynthia T. Faatz

(57) ABSTRACT

An approach for precise signal interpolation. For one aspect, each of the linear resistive elements in a first array of selectable linear resistive elements receives a first input signal. Each of the linear resistive elements is coupled to provide an output signal on a first output signal line. A variable bandwidth-compensating circuit is coupled to the first output signal line to compensate the bandwidth of the output signal.

11 Claims, 11 Drawing Sheets

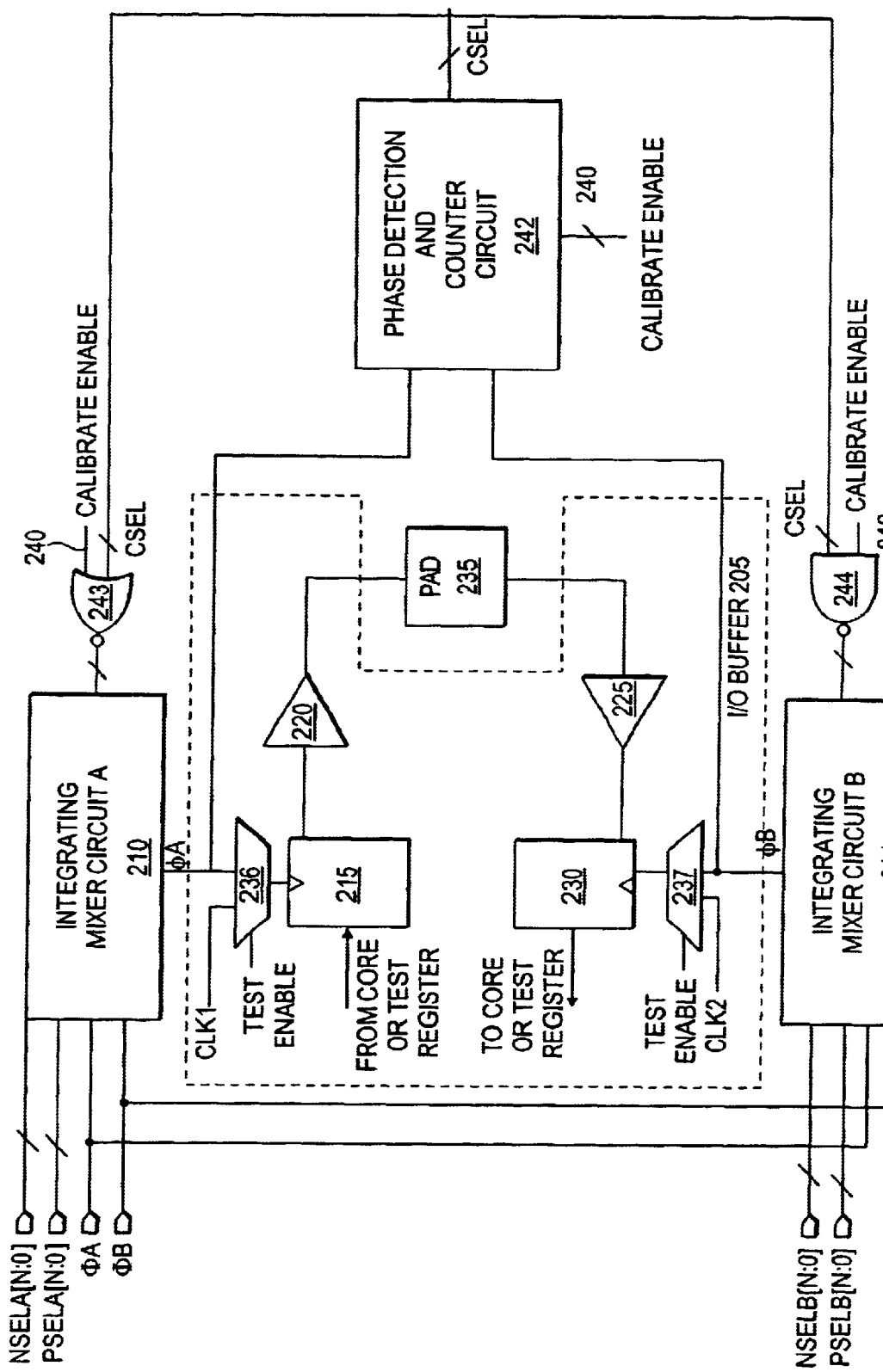

METHOD AND APPARATUS FOR PRECISE SIGNAL INTERPOLATION

CROSS-REFERENCE TO RELATED APPLICATION

The present application may be related to U.S. patent application Ser. No. 10/162,671, filed on Jun. 6, 2002, entitled "ARRANGEMENTS FOR SELF-MEASUREMENT OF I/O TIMING", having inventors Harry MULJONO and Alper ILKBAHAR and assigned to the assignee of the present invention and/or, U.S. patent application Ser. No. 10,334,070 filed on Dec. 31, 2002, entitled, "ARRANGEMENTS FOR SELF-MEASUREMENT OF I/O SPECIFICATIONS," having inventors Alper ILKBAHAR, Harry MULJONO, and Yan-mei TIAN and assigned to the assignee of the present invention.

BACKGROUND

1. Field

An embodiment of the present invention relates to the field of high frequency integrated circuits and, more particularly, to signal interpolation.

2. Discussion of Related Art

There are a variety of applications that may benefit from the use of a signal interpolator or other circuitry that provides phase-stepped signal edges. One such application is integrated circuit device testing.

For example, to reduce test costs associated with high frequency chip interfaces, a self-test technique referred to as I/O loopback may be used to test I/O timings. In an exemplary I/O loopback testing approach, the ability of an input buffer to correctly latch data driven by an output buffer on the same chip is measured while the timing of associated signals is adjusted to determine the passing range for the I/O buffer. An example of an I/O loopback testing approach is described in U.S. Pat. No. 5,621,739 to Sine et al. assigned to the assignee of the present invention.

To perform I/O loopback testing, it is desirable to be able to generate half-quadrature clock phases for accurate timing measurements. If the clock signals used to perform the I/O self-test are adversely affected by process, voltage and/or temperature variations, clock jitter or other factors, testing of the I/O circuitry may be inaccurate. Inaccurate testing may result in false failures or false passes of the test, either of which may be costly to the manufacturer, the system supplier or the end user.

As a balancing factor, the circuitry that provides the variable signals used to perform such testing may not be useful during normal operation of the integrated circuit. Thus, while it is desirable to have a high level of accuracy in producing signals used for testing, it is also desirable to keep the circuit real estate and development costs relatively small.

BRIEF DESCRIPTION OF THE DRAWINGS

The present invention is illustrated by way of example and not limitation in the figures of the accompanying drawings in which like references indicate similar elements, and in which:

FIG. 2 is a diagram showing an exemplary I/O buffer and precise signal interpolator arrangement that may be advantageously used in the system of FIG. 1.

DETAILED DESCRIPTION

A method and apparatus for precise signal interpolation is described. In the following description, particular types of integrated circuits, circuit configurations and circuit applications are described for purposes of illustration. It will be appreciated, however, that other embodiments are applicable to other types of integrated circuits, other uses, and to integrated circuits configured in another manner.

For one embodiment, a circuit includes a first array of selectably enableable linear resistive elements. Each of the linear resistive elements is to receive a first input signal and is also coupled to provide an output signal on a first output signal line. A variable bandwidth-compensating circuit is coupled to the first output signal line to compensate the bandwidth of the output signal.

For one embodiment, a second array of selectably enableable linear resistive elements may also be included wherein each of the linear resistive elements in the second array is to receive a second input signal and is coupled to provide an output signal on the first output signal line, such that the outputs of the first and second arrays are mixed to provide an interpolated output signal.

Further details of these and other embodiments are provided in the description that follows.

Figure 1:
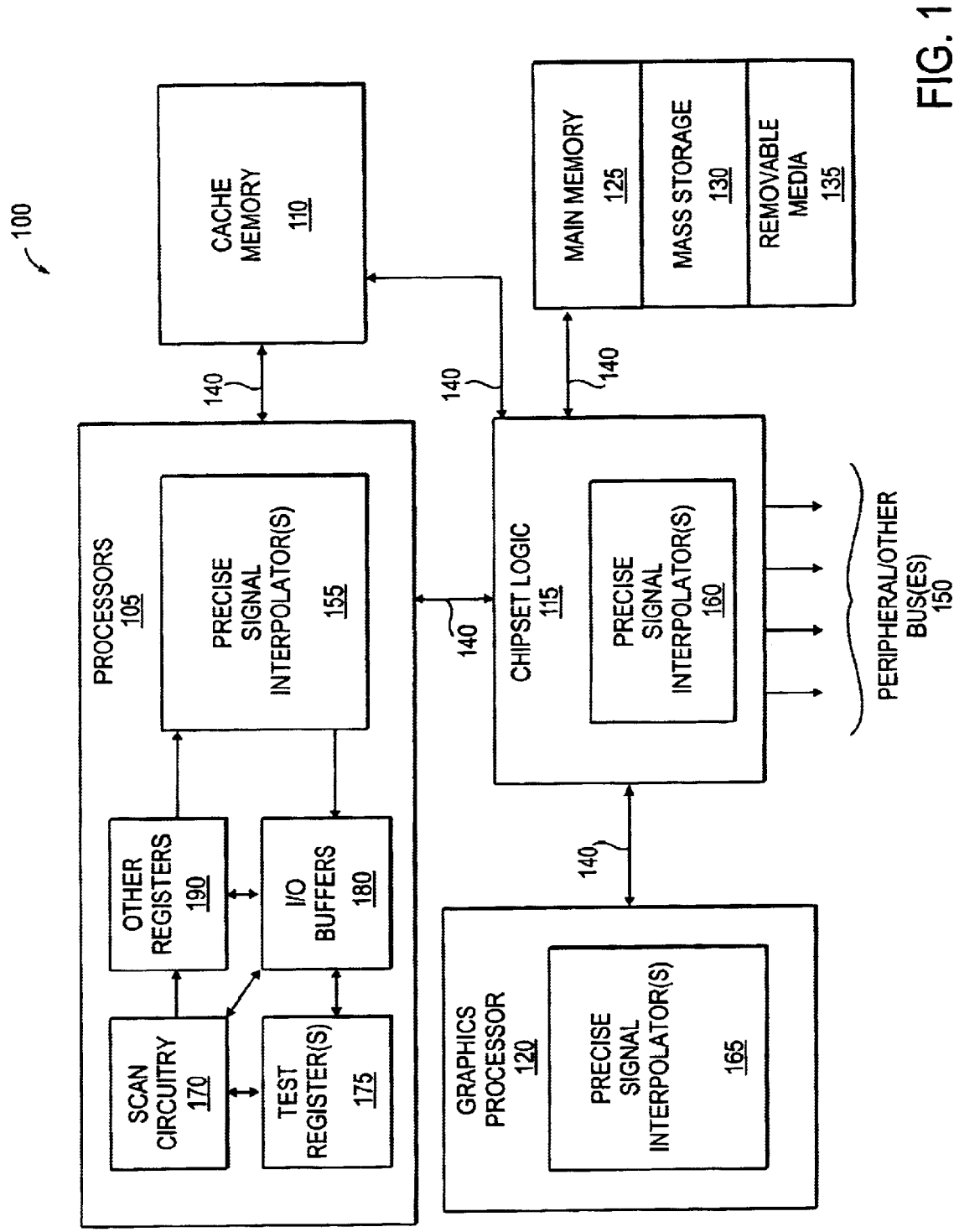
FIG. 1 is a high-level block diagram of a system of one embodiment including integrated circuit devices having a precise signal interpolator in accordance with one embodiment.

FIG. 1 is a block diagram of an electronic system 100 of one embodiment in which a signal interpolator may be advantageously used. The example electronic system 100 of FIG. 1 is a computer system that includes components such as a processor 105, a cache memory 110, chipset logic 115, and a graphics processor 120. The electronic system 100 may also include external memory such as a main memory 125 in the form of random access memory (RAM), one or more mass storage device(s) 130 and/or removable media 135 such as diskette(s), compact disc(s) (CDs), digital versatile disc(s) and the like. The components of the electronic system 100 may be interconnected by one or more buses 140, one or more of which may be a simultaneous bidirectional bus.

As used herein, the term processor refers to any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

The chipset logic 115 may include any one or more supporting circuits that couple the processor 105 to other devices. For example, the chipset logic 115 may include memory control circuitry, bus interface circuitry, node control circuits, port switching circuits, etc. For one embodiment, the chipset logic 115 provides interfaces to various internal and external buses including the buses 140 and peripheral and other buses 150 such as, for example, a peripheral component interconnect (PCI) bus, a universal serial bus (USB), and/or an industry standard architecture (ISA) bus. The chipset logic 115 of FIG. 1 may also provide an interface to other desired buses or devices.

In the exemplary embodiment shown in FIG. 1, each of the processor 105, the chipset logic 115 and the graphics processor 120, in addition to other logic, includes one or more on-chip interpolators 155, 160 and 165, respectively that may be used for input/output (I/O) self-testing or for another function. For other embodiments, a different subset of the components of the electronic system 100 may include one or more interpolators in accordance with one or more embodiments.

The exemplary processor 105 also includes scan circuitry 170, such as boundary scan circuitry in accordance with IEEE specification 1149.1 promulgated by the Joint Test Action Group (JTAG), one or more programmable test registers 175, I/O buffers 180 and other programmable registers 190 as well as other logic not shown in FIG. 1.

It will be appreciated that for other embodiments, the electronic system may include different components and/or may be configured in another manner.

FIG. 2 is a block-level and schematic diagram showing an exemplary I/O buffer 205 and precise signal interpolators 210 and 211 of one embodiment that may be used to provide one of the I/O buffers 180 and the signal interpolator 155, respectively, on the processor 105, for example. For the embodiment shown in FIGS. 2 and 3, the precise signal interpolators 210 and 211 are referred to alternatively as dual-barrel, dual-rail, transconductance mixer circuits or simply integrating mixer circuits based on their configuration and operation as described in more detail below.

The I/O buffer 205 includes an output latch 215, an output buffer 220, an input buffer 225 and an input latch 230. The input buffer 225 has an input connected to a pad 235 while the output buffer 220 has an output connected to the pad 235. The pad 235 may be electrically connected to a pin (not shown) of the processor 105 package, for example.

During normal operation of the processor 105 or other device on which the I/O buffer 205 is included, data from the device core logic (not shown) may be latched at the output latch 215 in response to a first clock signal (CLK1) such as a data clock signal received at the latch. Further, input data received at the pad 235 may be provided through the input buffer 225 to the input latch 230 and latched in response to a second clock signal (CLK2) such as a strobe clock signal. The input data may then be provided to the processor core logic.

As described above, in order to reduce test costs, it may be desirable to provide I/O self-test capabilities on the processor 105 or another device. This capability may be particularly helpful, for example, where the I/O buffers send and receive data over a simultaneous bi-directional bus. In accordance with one embodiment, integrating mixer circuits 210 and 211 in FIG. 2 may be selectively coupled to the output latch 215 and the input latch 230, respectively, during a test mode. Integrating mixer circuits 210 and 211 may be used to facilitate I/O loopback testing, for example, by providing half-quadrature clock phases as described in more detail below.

For the embodiment shown in FIG. 2, to selectively couple the integrating mixer circuits 210 and 211 to the output and input latches 215 and 230, respectively, multiplexers (muxes) 236 and 237 are provided. The multiplexer 236 is responsive to a test enable signal to select between the clock signal CLK1 used during normal operation of the I/O buffer 205 and the output of the integrating mixer circuit 210 to be provided to the output latch 215. Similarly, the multiplexer 237 is responsive to the test enable signal to selectively couple either the CLK2 signal or the output of the integrating mixer circuit 211 to the input latch 230. The test enable signal may be received from an external pin (not shown) or a test register, for example. Other approaches for providing a test enable signal are within the scope of various embodiments.

For one embodiment, outputs of the integrating mixer circuits 210 and 211 may be selectively coupled to each of the I/O buffers on the processor 105 in a manner similar to that shown in FIG. 2. For another embodiment, one or more additional interpolators may be provided at different locations on the processor.

Figure 3A:
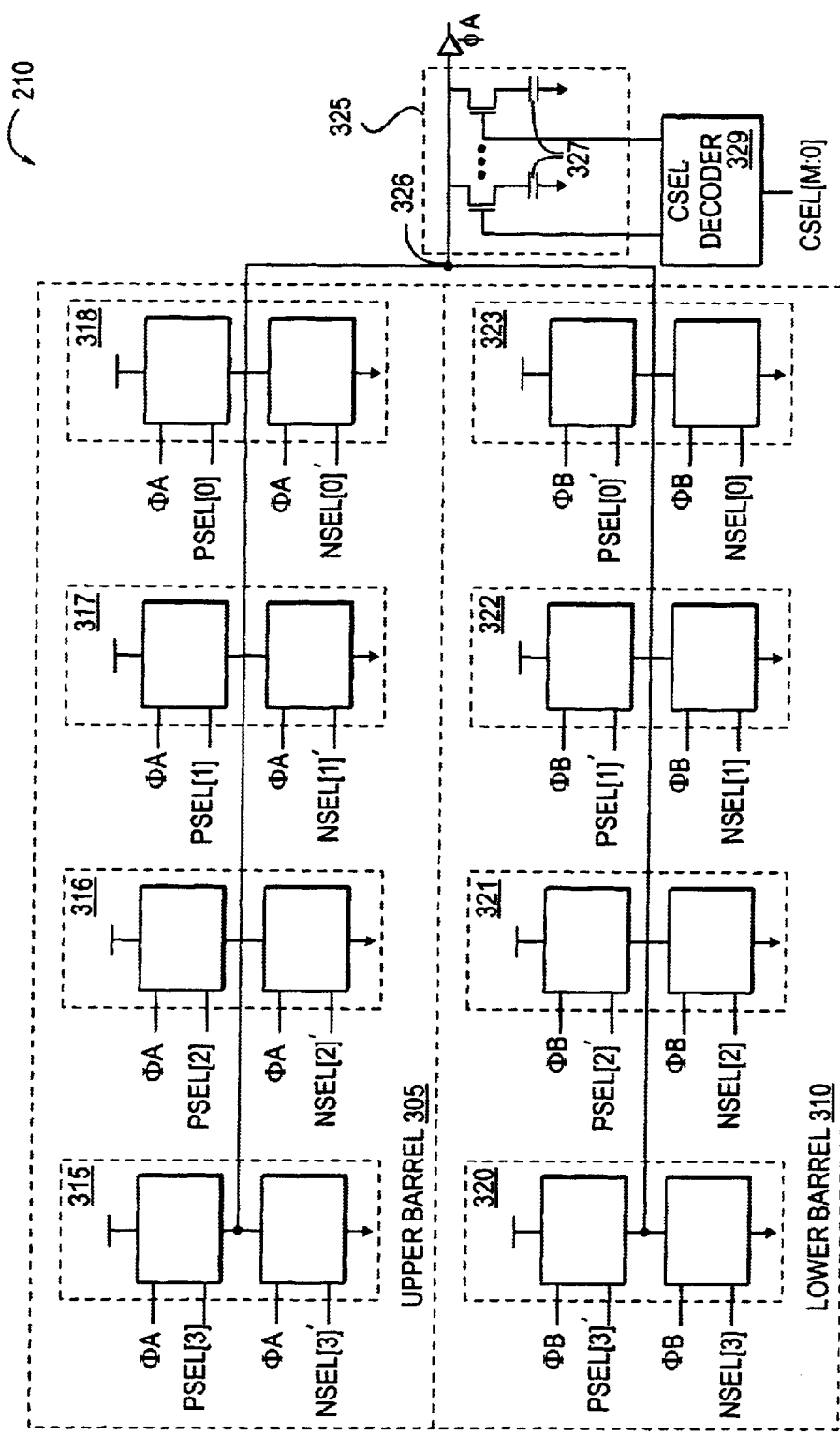
FIG. 3A is a schematic diagram of an exemplary integrating mixer circuit that may be used to provide the precise signal interpolator of FIG. 2 with select signals corresponding to rising edge transitions of input clock signals.
Figure 3B:
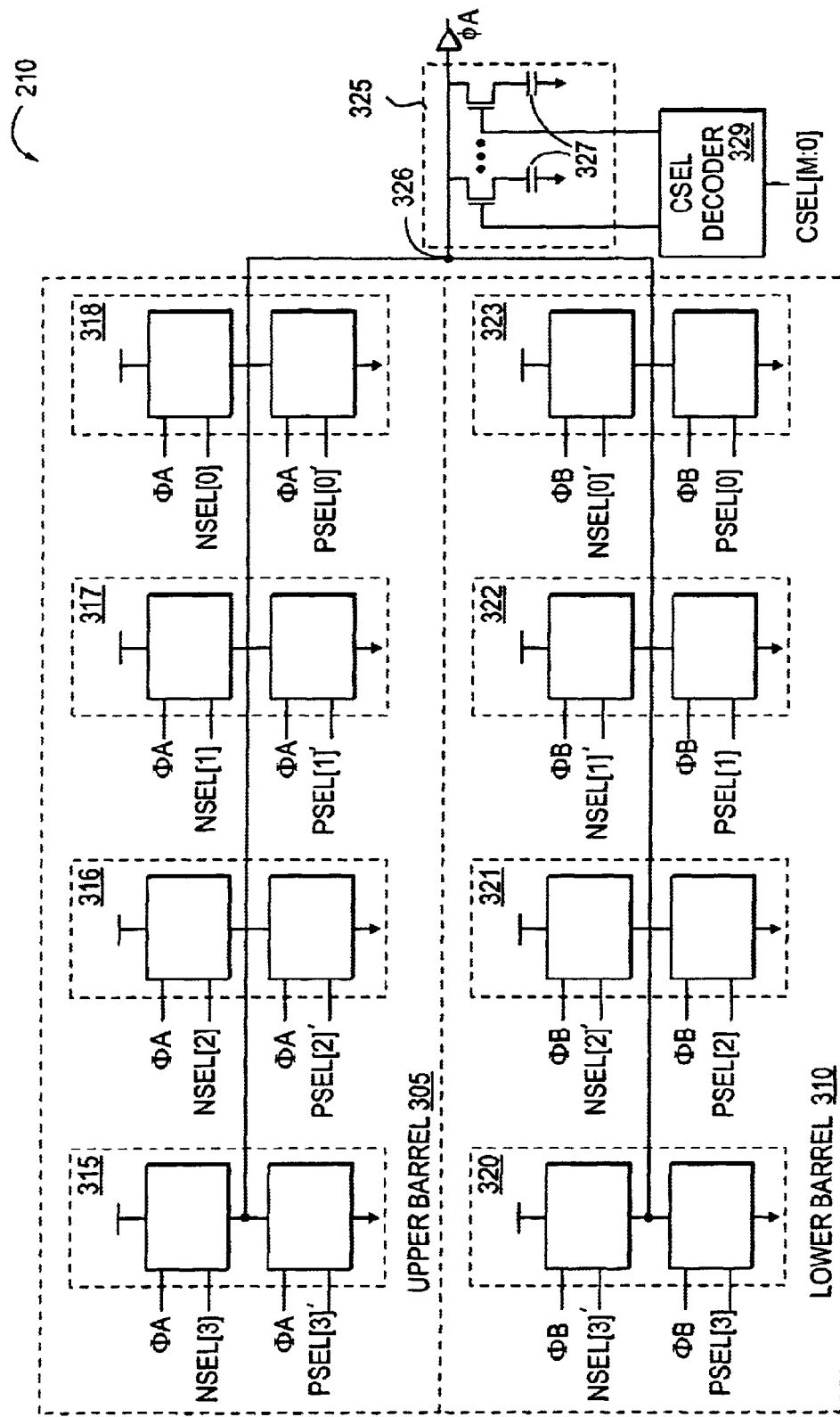
FIG. 3B is a schematic diagram of an exemplary integrating mixer circuit that may be used to provide the precise signal interpolator of FIG. 2 with select signals corresponding to falling edge transitions of input clock signals.

FIGS. 3A and 3B are schematic diagrams showing the integrating mixer circuit 210 of one embodiment in more detail with select signals varied from FIG. 3A to FIG. 3B depending on whether rising or falling edge transitions are being tested. It will be appreciated that the integrating mixer circuit 211 may be implemented in a similar manner.

Referring to FIG. 3A for purposes of example, the integrating mixer circuit 210 includes an upper barrel 305 and a lower barrel 310. Each of the upper barrel 305 and the lower barrel 310 includes an array of linear resistive elements 315–318 and 320–323, respectively. While four linear resistive elements are included in each of the upper and lower barrels 305 and 310 in FIG. 2, it will be appreciated that a different number of linear resistive elements may be used for other embodiments depending on a variety of factors including, for example, the desired precision of the circuit.

Figure 4:
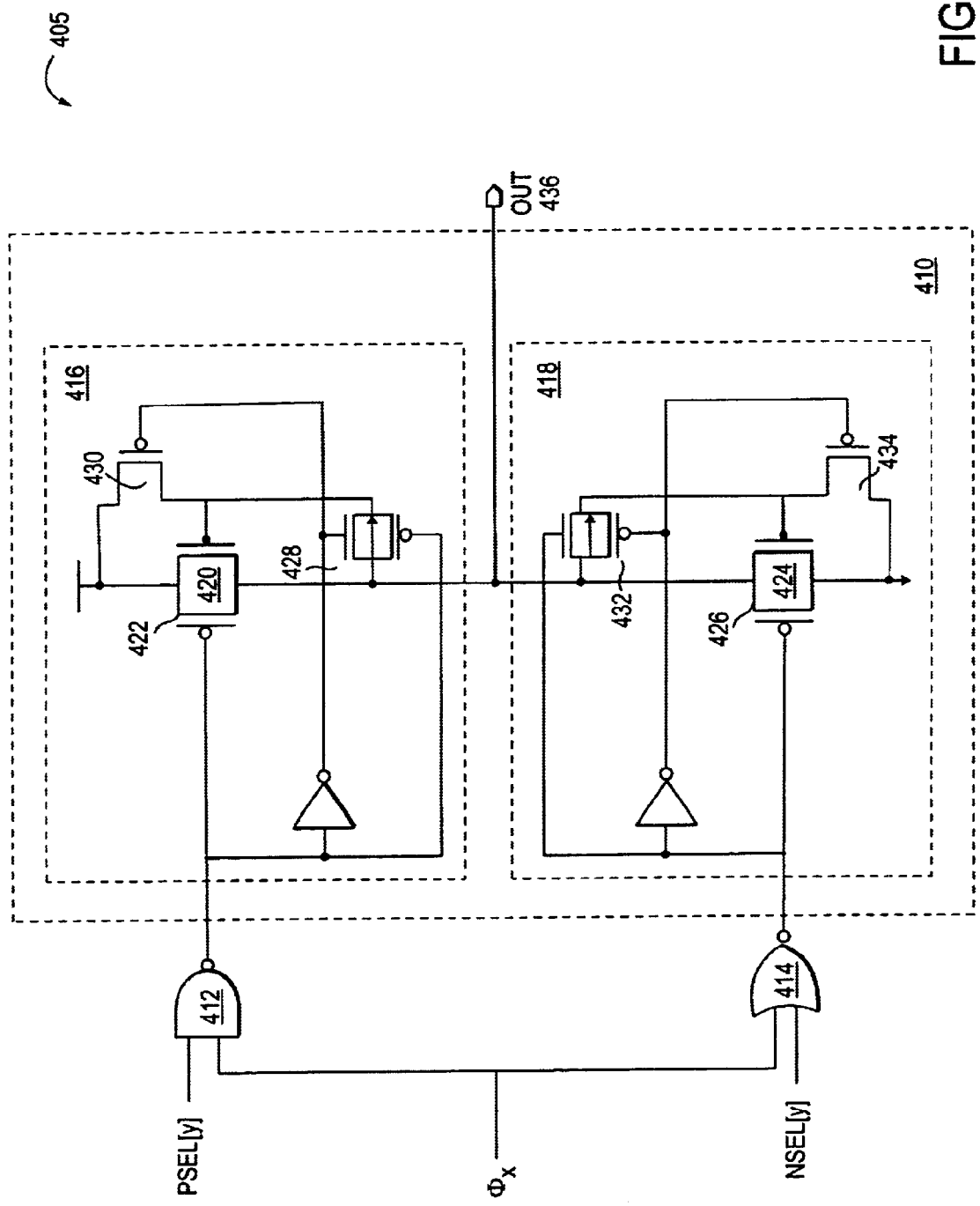
FIG. 4 is a schematic diagram of an exemplary gate including a source-coupled inverter that may be advantageously used to provide the linear resistive elements in the integrating mixer circuit of FIG. 3.

In the exemplary embodiment shown in FIG. 3A, one or more of the linear resistive elements 315–318 and/or 320–323 may be provided by a logic gate that includes a totem-pole, source-coupled inverter such as the exemplary logic gate 405 of FIG. 4 that essentially acts as a current source. The exemplary logic gate 405 includes a totem-pole, source-coupled inverter 410, a NAND gate 412 and a NOR gate 414. Each of the NAND gate 412 and the NOR gate 414 is coupled to receive an input clock signal $\Phi_X$ and a respective select signal PSEL[Y] or NSEL[Y].

The totem-pole, source-coupled inverter 410 includes symmetric loads 416 and 418. The symmetric load 416 includes an effectively diode-connected p-channel transistor 420 in shunt with a substantially equally sized, biased p-channel transistor 422. The bias for the p-channel transistor 422 is provided by the output of the NAND gate 412. Similarly, the symmetric load 418 includes an effectively diode-connected n-channel transistor 424 in shunt with a substantially equally sized, biased n-channel transistor 426, wherein the bias is provided by the output of the NOR gate 414.

For one embodiment, the transistors 420, 422, 424 and 426 are sized such that the pull-down strength of the inverter 410 is substantially equivalent to its pull-up strength.

The symmetric load 416 also includes a pass gate 428 and a weak pull-up transistor 430 while the symmetric load 418 includes a pass gate 432 and a weak pull-down transistor 434. The pass gates 428 and 432 are provided to ensure that the respective devices 420 and 424 are turned off when desired while the weak pull-up device 430 and weak pull-down device 434 are provided to ensure that the gates of the respective devices 420 and 424 are not floating when the output of the NAND gate 412 transitions high or the output of the NOR gate 414 transitions low.

In operation, in the implementation of FIG. 4, PSEL[Y] is active high while NSEL[Y] is active low. When PSEL[Y] is high, in response to $\Phi_X$ transitioning high, an output of the NAND gate 412 transitions low such that transistor 422 is enabled to pull the output node 436 high. Because $\Phi_X$ is high, the output of the NOR gate 414 remains low such that the gate 426 is disabled regardless of the value of NSEL[Y].

Conversely, when $\Phi_X$ transitions low, if NSEL[Y] is low, the output of the NOR gate 414 transitions high such that the transistor 426 is turned on and the output node 418 is pulled low. When $\Phi_X$ is low, the output of the NAND gate 412 remains high regardless of the value of PSEL[Y].

Thus, the PSEL and NSEL signals shown in FIGS. 2–4 determine the number of linear resistive elements that are enabled in each of the upper barrel 305 and the lower barrel 310 in FIG. 3A.

In the configuration shown in FIG. 4, the transistors 422 and 426 operate in the linear region while transistors 420 and 424 operate in the saturation region. The symmetric loads 416 and 418 provide the advantage that their IV (current vs. voltage) characteristics are substantially equivalent to that of a linear resistor as described in detail in a paper by John G. Maneatis entitled, "Low-Jitter Process-Independent DLL and PLL Based on Self-Biased Techniques," IEEE Journal of Solid-State Circuits, Vol. 31, No. 11, November 1996.

Referring back to FIG. 3A, for another embodiment, one or more of the linear resistive elements 315–318 and/or 320–323 may be replaced by another type of linear resistive element such as, for example, an active linear resistor or a passive linear resistor such as a poly and gated-blocked N-well resistor.

In addition to the above-described linear resistive elements 315–318 and 320–323, the exemplary integrating mixer circuit 210 includes a variable bandwidth-compensating circuit 325 coupled to an output of each of the linear resistive elements 315–318 and 320–323 at a mixing node 326. For one embodiment, the variable bandwidth-compensating circuit 325 includes an array of parallel-coupled, individually selectable capacitive elements 327, wherein the selected capacitive elements act as a linear load capacitor. The capacitive elements 327 may be provided by, for example, metal-side capacitors.

For the embodiment shown in FIG. 3A, the number of selected capacitive elements 327 is responsive to the CSEL [M:0] signal. The CSEL[M:0] signal may be decoded by a CSEL decoder such that the desired capacitive elements 327 are enabled. For one embodiment, the variable bandwidth-compensating circuit 325 includes 16 selectable capacitive elements 327 and the CSEL signal is a 4-bit signal. It will be appreciated that a different number and/or type of capacitive elements may be used for other embodiments. Further, it will be appreciated that the variable bandwidth-compensating circuit 325 may be implemented in another manner to provide similar functionality.

Referring to FIGS. 2 and 3A, for one embodiment, prior to use of the integrating mixer circuits 210 and 211 for testing, a calibration operation is performed in response to a calibrate enable signal received over a calibrate enable signal line 240 at a phase detection and counter circuit 242 and at logic gates 243 and 244. The calibrate enable signal may be received, for example, from a user-enabled test register such as through JTAG or other scan circuitry. The phase detection and counter circuit 242 of one embodiment includes a conventional phase detector circuit having an output coupled to a conventional up and/or down counter.

For the calibration operation, values for NSEL[N:0], PSEL[N:0] and CSEL[M:0] for each of the integrating mixer circuits 210 and 211 are fixed at an initial default setting. The calibration settings for the NSEL, PSEL and CSEL signals may be set using values stored in a calibration register that may be part of the test register(s) 175, the other registers 190 or may be set via scan circuitry 170 (FIG. 1). For one embodiment, for the upper integrating mixer circuit, NSELA[N:0] is set to all 0s, PSELA[N:0] is set to all 1s and CSELA[M:0] is controlled by the CSEL decoder to generate $\phi_A+\Delta$. The lower integrating mixer circuit 211 has PSELB [N:0] set to all 0s, NSELB[N:1] set to all 1s and CSELB[M:0] set to all 0s to generate $\phi_B$.

$\Phi_A$ and $\Phi_B$ signals are then provided at the inputs of each of the integrating mixer circuits 210 and 211 as shown in FIG. 2. In response, the integrating mixer circuit 210 produces an output signal $\phi_A$ while the integrating mixer circuit 211 produces an output signal $\phi_B$. Each of the output signals $\phi_A$ and $\phi_B$ are provided to the phase detection and counter circuit 242. The phase detection and counter circuit 242 detects a phase difference between the $\phi_A$ and $\phi_B$ signals and then counts up or down from the current CSEL value (i.e. adds or subtracts capacitance from the respective mixing node) depending on which of the $\phi_A$ or $\phi_B$ signals is received first. Put differently, the bandwidth of the output line of at least one of the mixer circuits 210 and/or 211 is adjusted during this calibration operation by adjusting the output capacitance.

For one embodiment, the CSEL value is provided to a CSEL input of both of the integrating mixer circuits 210 and 211 as shown in FIG. 2. The CSEL value of only one of the mixer circuits 210 or 211 is adjusted, however, depending on which integrating mixer circuit 210 or 211 receives the later clock input signal.

For one embodiment, the CSEL adjustment is gated using the NOR gate 243 for the integrating mixer circuit 210 and the NAND gate 244 for the integrating mixer circuit 211 as shown. Each of the NAND gate 244 and the NOR gate 243 receives the CSEL signal and the calibrate enable signal. In the example provided above, the lower integrating mixer circuit 211 receives a constant CSEL value of all 0s . It will be appreciated that, where $\Phi_B$ is the early signal instead of $\Phi_A$, the CSEL settings may be reversed.

This process of detecting the phase difference Δ between the $\phi_A$ and $\phi_B$ signals and adjusting the CSEL value to modulate Δ is iterated until the phase difference between the $\phi_A$ and $\phi_B$ signals is less than the resolution of the phase detection and counter circuit 242. At this point, the CSEL values for each of the integrating mixer circuits 210 and 211 to be used for testing are set for a particular edge transition (i.e. either rising or falling). A separate, similar calibration operation is performed for the opposite edge transition. Using this approach, process, voltage and/or temperature (PVT) variations may be compensated for to ensure accurate operation of the integrating mixer circuits 210 and 211 during testing.

Once the integrating mixer circuits 210 and 211 have been calibrated, an interpolation phase, such as is used for I/O self-testing, is enabled in response to the deassertion of the calibrate enable signal. Other approaches for enabling an interpolation phase are within the scope of various embodiments.

For one embodiment, I/O loopback testing of the I/O buffer 205 may be performed substantially in accordance with the approach described in U.S. Pat. No. 5,621,739 to Sine et al., assigned to the assignee of the present invention or in accordance with the approach described in the related application referenced in the section entitled, "Cross-Reference to Related Application" above. In contrast to Sine, however, clock signals provided to the input and/or output latches are varied using the integrating mixer circuits 210 and/or 211 in the manner described below.

The operation of the integrating mixer circuits 210 and 211 is described in reference to the exemplary integrating mixer circuit 210 of FIG. 3A. It will be appreciated that the integrating mixer circuit 211 of one embodiment operates in a similar manner.

During the interpolation phase, as mentioned above, the integrating mixer circuit 210 receives clock signals $\Phi_A$ and $\Phi_B$, also referred to herein as early and late signals, respectively, due to the fact that they are out of phase with each other. In response to receiving the early and late signals, the integrating mixer circuit 210 provides an interpolated output signal having a phase that is dependent upon the values of the PSEL[N:0] and NSEL[N:0] signals.

More particularly, during interpolation when the early and late signals are at opposite signaling levels (i.e. one is high and the other is low), the output of the upper barrel may be in contention with the output of the lower barrel. During this interval, the number of linear resistive elements that are selected and switched on in the upper barrel versus the number of linear resistive elements that are selected and switched on in the lower barrel represents the electrical strength or transconductance, gm of $\Phi_A$ against $\Phi_B$.

Figure 5:
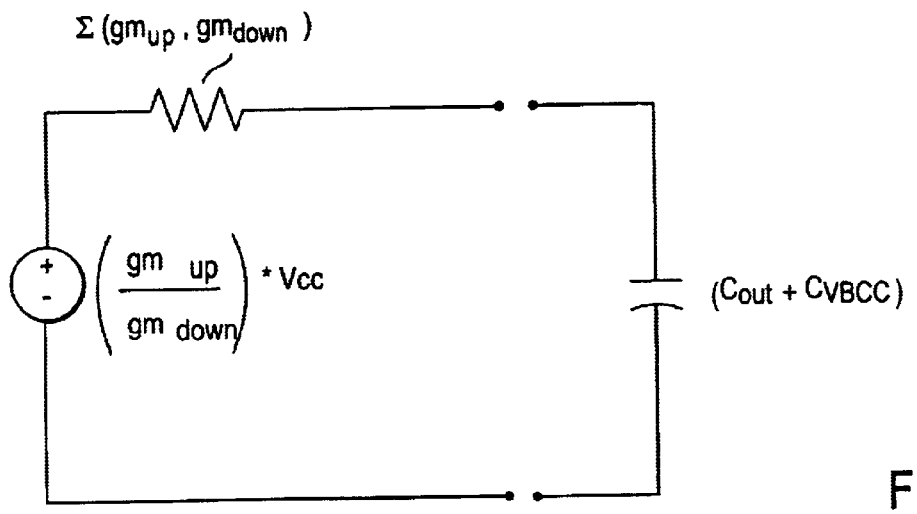
FIG. 5 is a diagram showing a Thevenin equivalent circuit for the integrating mixer circuit of FIG. 3.

The equivalent circuit during this time can be calculated using Thevenin's theorem, where the equivalent final output transconductance $gm_{OUT}$ is simply the sum of $gm_{UP}$ (sum of pull-up strength in upper and lower barrels) and $gm_{DOWN}$ (sum of pull-down strength in upper and lower barrels), with equivalent voltage equal to the ratio of $gm_{UP}$ and $gm_{DOWN}$ multiplied by VCC as shown in FIG. 5.

By attaching the variable bandwidth-compensating circuit (which, in the embodiment shown in FIG. 3A comprises linear load capacitors) at the output node, first order linear timing generation is attained. The equivalent capacitance is given by the sum of the output capacitance (Cout) and the capacitance of the variable bandwidth-compensating circuit (CVBCC).

Thus, by changing the number of selected linear resistive elements in respective barrels, transconductance blending is achieved in the output signal $\phi_A$ such that the phase of the output signal $\phi_A$ may adjusted.

For the embodiment shown in FIGS. 3A and 3B for which four linear resistive elements are included in each of the upper and lower barrels 305 and 310, Table 1 below provides exemplary values for the PSEL[3:0] and NSEL[3:0]' (i.e. the complement of NSEL[3:0]) signals for rising and falling edge transitions of the input signals to achieve such transconductance blending.

As mentioned above, FIG. 3A shows the configuration of the input signals for rising edge transitions while FIG. 3B shows the configuration of the input signals for falling edge transitions. For one embodiment, switching of the input signals in this manner is performed using inverters (not shown) to provide the complementary signals and multiplexers (not shown) to select between the input signals to be provided at each select input depending on the edge transition of interest for the input clock signals.

In Table 1, a value of 1 indicates that the corresponding signal is at a logic high level while a value of 0 indicates that the corresponding signal is at a logic low level. It will be noted, as described above, that NSEL signals are active low while PSEL signals are active high in this exemplary embodiment. The PSEL and NSEL values may be loaded from on-chip registers or other memory or may be provided via scan circuitry 170.

Table 1 also provides an exemplary Δt value for each group of PSEL and NSEL values. In Table 1, Δt indicates the net time between the output signal MPA that results from the first entry in Table 1 (i.e. where NSEL[3:0] is set to all 0s and PSEL[3:0] is set to all 1s) and the output signal $\phi_A$ that results from the corresponding entry in Table 1, where ΔT is the total delay between the signals resulting from the first and last entries in Table 1. It will be noted that these values are approximate and may vary depending on the particular implementation.

TABLE 1

| NSEL [0]' | NSEL [1]' | NSEL [2]' | NSEL [3]' | PSEL [0] | PSEL [1] | PSEL [2] | PSEL [3] | Δt |
|---|---|---|---|---|---|---|---|---|
| 0 | 0 | 0 | 0 | 1 | 1 | 1 | 1 | 0 ΔT |
| 0 | 0 | 0 | 1 | 1 | 1 | 1 | 1 | ~1/8 ΔT |
| 0 | 0 | 1 | 1 | 1 | 1 | 1 | 1 | ~1/4 ΔT |
| 0 | 1 | 1 | 1 | 1 | 1 | 1 | 1 | ~3/8 ΔT |
| 1 | 1 | 1 | 1 | 1 | 1 | 1 | 1 | ~1/2 Δt |
| 1 | 1 | 1 | 1 | 0 | 1 | 1 | 1 | ~5/8 ΔT |
| 1 | 1 | 1 | 1 | 0 | 0 | 1 | 1 | ~3/4 ΔT |
| 1 | 1 | 1 | 1 | 0 | 0 | 0 | 1 | ~7/8 ΔT |
| 1 | 1 | 1 | 1 | 0 | 0 | 0 | 0 | ΔT |

As shown in FIG. 3A, for example, the linear resistive elements 315–318 in the upper barrel 305 receive PSEL[3:0] signals and complements of NSEL[3:0] signals (shown as NSEL[3:0]'), while the linear resistive elements 320–323 in the lower barrel receive complements of the PSEL [3:0] signals (shown as PSEL [3:0]') and NSEL[3:0] signals. NSEL and PSEL control signals are driven dynamically by NSEL and PSEL values depending on the input signal edges to be interpolated. For rising edge transitions, the PSEL and NSEL control signals for the upper and lower barrels are related to transconductance (gm) through the following equations:

For rising edge transitions:

For the upper barrel 305: $gm_N \, \alpha \, NSEL[N:0]' \cdot \Phi_A$ $gm_P \, \alpha \, PSEL[N:0]' \cdot \Phi_A$ For the lower barrel 310: $gm_N \, \alpha \, NSEL[N:0] \cdot \Phi_B$ $gm_P \, \alpha \, PSEL[N:0]' \cdot \Phi_B$ For falling edge transitions:

For the upper barrel 305: $gm_N \, \alpha \, PSEL[N:0]' \cdot \Phi_A$ $gm_P \, \alpha \, NSEL[N:0] \cdot \Phi A$ For the lower barrel 310: $gm_N \, \alpha \, PSEL[N:0] \cdot \Phi_B$ $gm_P \, \alpha \, NSEL[N:0]' \cdot \Phi_B$ For purposes of illustration, it is presumed that NSEL [3:0]'=0000 and PSEL[3:0]=1111 as indicated by the first entry in Table 1. Referring to FIGS. 3A and 4, for a rising edge of $\Phi_A$ where $\Phi_B$ is low, these values cause pull-up devices in each of the linear resistive elements 315–318 in the upper barrel to be enabled while no pull-down devices in either the upper or lower barrels 305 or 310 are enabled. In this manner, full pull-up strength is applied and the phase of the output signal $\phi_A$ is very close to that of the early input signal.

For the entry in Table 1 for which both PSEL[3:0] and NSEL[3:0]' values are all 1s, pull-up devices in all of the linear resistive elements in the upper barrel 305 are turned on while pull-down devices in all of the linear resistive elements in the lower barrel 310 are also turned on. In this manner, the phase of the output signal $\phi_A$ is about half way in between the phase that is produced by full pull-up strength as described above, and the full pull-down strength given by the last entry in Table 1.

Other PSEL and NSEL values operate in a similar manner to adjust the phase of the output signal $\phi_A$ as indicated. As described, the PSEL and NSEL values of Table 1 are applicable for falling edge transitions of the input signals $\Phi_A$ and $\Phi_B$ where the input signals are provided as shown in FIG. 3B.

Thus, the delay of the output signal $\phi_A$ from the integrating mixer circuit 210 can be adjusted in the manner described above to, for example, vary the I/O testing window such that I/O timings can be accurately tested. Further, by calibrating the circuitry before testing as described above, process, voltage and/or temperature variations may be compensated for. It will be appreciated that the integrating mixer circuit 211 of one embodiment operates in a similar manner such that the input latch 230 timings can be varied separately or in conjunction with variations in the output latch 215 timings.

Results of such I/O self-tests can be stored in an on-chip memory such as the registers 190 and/or provided to an external functional tester, for example, through scan circuitry 170 (FIG. 1).

Figure 6:
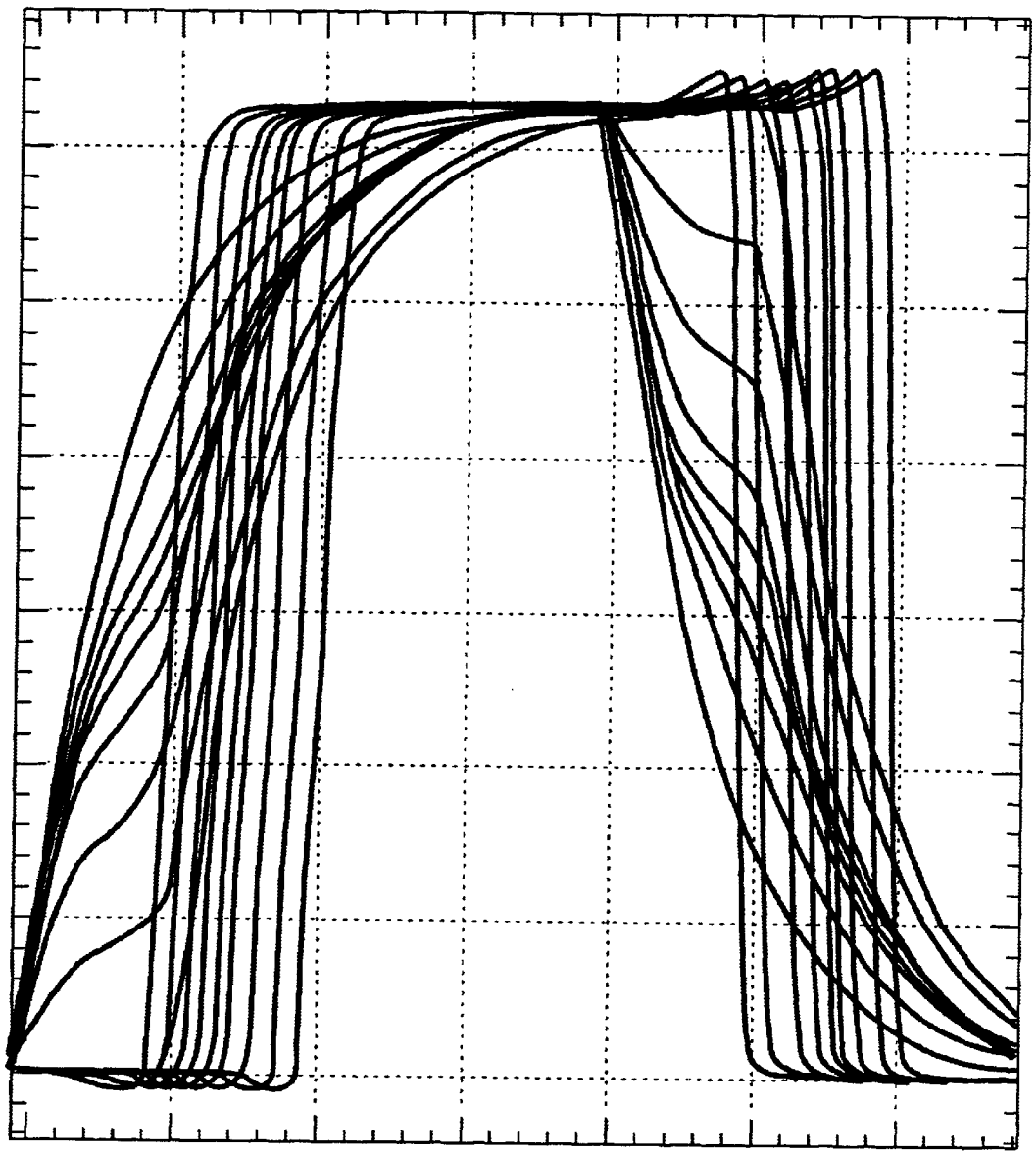
FIG. 6 is a timing diagram showing an exemplary output of the integrating mixer circuit of FIG. 3 with and without a variable delay-compensating circuit.

With continuing reference to FIG. 3A, without the variable bandwidth-compensating circuit 325, the output of the integrating mixer circuit 210 looks similar to the waveforms shown in FIG. 6 including the curves that rise (fall) initially and then flatten before rising (falling) sharply up (down).

The variable bandwidth-compensating circuit 325, however, linearizes the output in the manner shown by the set of waveforms in FIG. 6 approximating square waves such that a more desirable output signal characteristic is provided.

Referring back to FIG. 1, instead of using the integrating mixer circuits described above to provide one or more of the precise signal interpolators 155, 160, and/or 165 or another precise signal interpolator in the system 100, a direct resistive-capacitive (RC) delay switching interpolator may be used. Exemplary direct, RC-delay switching interpolators of one embodiment are shown in FIGS. 7 and 8.

Figure 7:
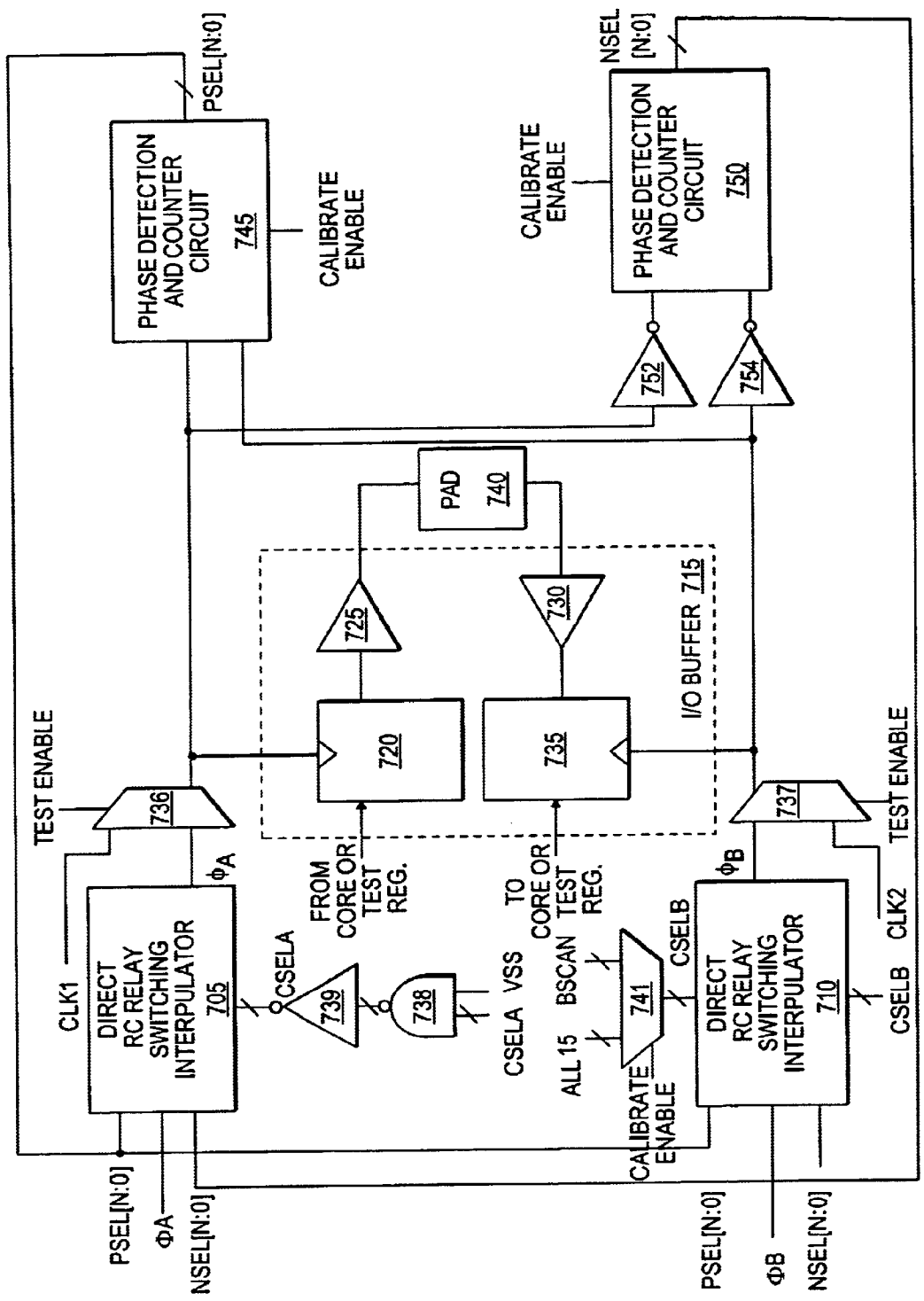
FIG. 7 is a diagram showing an exemplary I/O buffer and precise signal interpolator arrangement of another embodiment that may be advantageously used in the system of FIG. 1.
Figure 8:
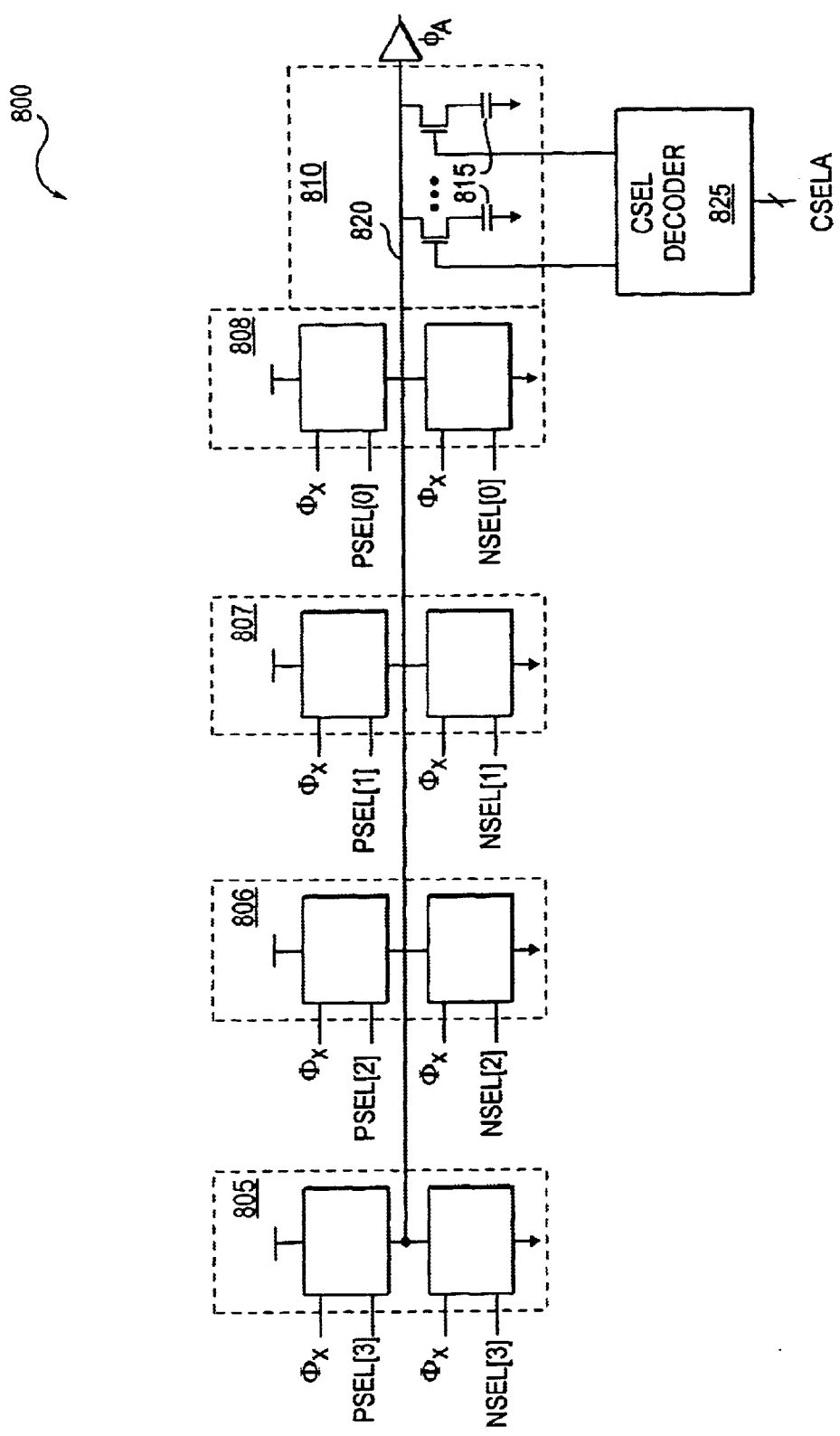
FIG. 8 is a schematic diagram of an exemplary direct RC-delay switching interpolator that may be used to provide the precise signal interpolator of FIG. 7.

FIG. 7 shows an exemplary configuration in which the direct RC-delay switching interpolators of one embodiment may be advantageously used. For purposes of illustration, exemplary direct RC-delay switching interpolators 705 and 710 are described as being coupled to an I/O buffer 715 that may be provided on, for example, the processor 105 of FIG. 1. For one embodiment, the direct RC-delay switching interpolators 705 and 710 are coupled to each I/O buffer on the processor 105 in a similar manner. For other embodiments, additional interpolators may be included. Other uses for the direct RC-delay switching interpolator will be appreciated by those of ordinary skill in the art.

Like the I/O buffer 205 of FIG. 2, the I/O buffer 715 includes an output latch 720, an output buffer 725, an input buffer 730 and an input latch 735. The output and input buffers 725 and 730 may be coupled to a pad 740 of an integrated circuit on which they are included. The pad 740 may be bonded out to an I/O pin, for example.

For normal operation of the integrated circuit including the I/O buffer 715, clock signals CLK1 and CLK2, such as data and strobe clock signals, are provided to clock the output and input latches 720 and 735, respectively. During testing, however, in response to, for example, a test enable signal, the direct RC-delay switching interpolator 705 may be selectively coupled to provide a variable test clock signal to the output latch 720 via, for example, a multiplexer 736 while the direct RC-delay switching interpolator 710 may be selectively coupled to provide a variable test clock signal to the input latch 735 via, for example, a multiplexer 737.

FIG. 8 shows a schematic and block diagram of an exemplary direct RC-delay switching interpolator 800 that may be used to provide either or both of the direct RC-delay switching interpolators 705 and/or 710 of FIG. 7. The exemplary direct RC-delay switching interpolator 800 includes linear resistive elements 805–808 and a variable bandwidth-compensating circuit 810.

For one embodiment, each of the linear resistive elements 805 comprises a gate including a source-coupled, totem-pole inverter similar to the gate shown in FIG. 4 and described above. While four linear resistive elements 805 are shown in FIG. 8, the direct RC-delay switching interpolator of other embodiments may include a different number of linear resistive elements. Further, for other embodiments, one or more of the linear resistive elements 805–808 may comprise a different type of linear resistive element such as an active linear resistor or a passive linear resistor such as a poly and gated-blocked N-well resistor.

For the direct RC-delay switching interpolator 705 of FIG. 7, each of the linear resistive elements receives an input clock signal $\Phi_A$ and corresponding PSEL and NSEL values while the linear resistive elements of the direct RC-delay switching interpolator 710 receives an input clock signal $\Phi_B$ and corresponding PSEL and NSEL values.

The variable bandwidth-compensating circuit 810 of one embodiment comprises an array of parallel-coupled, selectable metal side capacitors 815. For one embodiment, each of the metal side capacitors is selectively coupleable to the signal line 820 in response to a select signal CSEL shown as CSELA in FIG. 8. For one embodiment, the CSEL signal is decoded by a CSEL decoder 825 as described above in reference to FIG. 2. For the embodiment shown in FIG. 8, 16 capacitors are included in the variable bandwidth-compensating circuit 810, but a different number may be included for other embodiments. Further, for other embodiments, the variable bandwidth-compensating circuit 810 may be implemented in another manner.

Referring to FIGS. 7 and 8, prior to using the direct RC-delay switching interpolators 705, for testing, for example, a calibration operation is performed to compensate for process, voltage and/or temperature variations. For one embodiment, the calibration operation may be initiated in response to a calibrate enable signal.

During the calibration operation, CSELA and CSELB signals are set at predetermined values. For one embodiment, the CSELA signals are all 0s while the CSELB signals are all 1s. The calibration settings for the interpolator 705 may be accomplished, for example, using NAND gates and inverters such as the NAND gate 738 and inverter 739, wherein one input of each NAND gate associated with each CSELA bit is tied to Vss. In this manner, an output of each NAND gate is always high and thus, all bits of CSELA are low. For the interpolator 710, a multiplexer 741 is responsive to the calibrate enable signal to select between all 1s for a calibration operation or values provided via boundary scan circuitry or other registers, for example, for an interpolation operation. For other embodiments or calibration settings, different circuitry may be provided.

For calibration, the input clock signals $\Phi_A$ and $\Phi_B$ have a predetermined or known phase difference. Assuming that CSELB provides for a maximum of 16 bits of capacitive load via the variable bandwidth-compensating circuit 810. Where $\Phi_A$ is later than $\Phi_B$ or $\Phi_A = \Phi_B + \theta$, the timing of the output signals $\phi_A$ and $\phi_B$ are determined by the following equations for rising edge transitions:

$$\phi_A = \Phi_A + Rp \star [Co + 0 \star Cload] \text{ (because CSELA is all 0s)}$$

$$\phi_B = \Phi_B + Rp \star [Co + 16 \star Cload]$$

Hence:

$$\phi_A - \phi_B = [\Phi_A - \Phi_B] - 16 \star Rp \star Cload$$

When calibration is locked (i.e. the phase difference between $\phi_A$ and $\phi_B$ is less than the resolution of the phase detection and counter circuits 745 and 750, $$\phi_A - \phi_B = 0$$

Therefore, $$Rp = [\Phi_A - \Phi_B]_{calibration}/(16 \star Cload) = \theta/(16 \star Cload)$$

where Rp is the total resistance of the PMOS devices that are turned on in response to the PSEL signal, Cload is the capacitance of an individual capacitor 815 in the variable bandwidth compensating circuit 810 and Co is the output capacitance of the circuit 800. The equations for falling edge transitions of the same signals are similar except Rn is used in place of Rp where Rn is the total resistance of the NMOS devices that are turned on in response to the NSEL signal.

In operation, to determine Rp, CSELA and CSELB values are set as described above and N+1 PMOS devices in each of the direct RC-delay switching interpolators are selected via the PSEL[N:0] control signals. It will be appreciated that a different number of PMOS devices may be selected.

$\Phi_A$ and $\Phi_B$ have a known phase difference and are provided at inputs to the direct RC-delay switching interpolators 705 and 710, respectively. In response, associated output signals $\phi_A$ and $\phi_B$ are provided to the phase detection and counter circuit 745 while complements of the $\phi_A$ and $\phi_B$ signals are provided to the phase detection and counter circuit 750 through inverters 752 and 754, respectively.

For the rising edge of signals $\phi_A$ and $\phi_B$, the phase detection and counter circuit 745 determines a phase difference between the two signals and then, based on that phase difference, counts up or down to provide an adjusted PSEL [N:0] value at an output. For one embodiment, the PSEL [N:0] value is provided to inputs of both of the interpolators 705 and 710, however, the PSEL value of only one interpolator is adjusted depending upon the value of the respective input clock signal. This functionality is achieved for one embodiment by gating the PSEL[N:0] signal using a NAND or NOR gate (not shown), for example, as described above. Other approaches to achieving this functionality are within the scope of various embodiments.

This process is repeated until the phase difference between the signals $\phi_A$ and $\phi_B$ is less than the resolution of the phase detection and counter circuit 745. At this point, the value of PSEL[N:0] for rising edge transitions is set and determines the value of Rp in the equations above.

For falling edge transitions of the $\Phi_A$ and $\Phi_B$ signals, the calibration process is similar except that the phase detection and counter circuit 750 adjusts the NSEL[N:0] values for the direct RC-delay switching interpolators until the phase difference of the output signals $\phi_A$ and $\phi_B$ is less than the resolution of the phase detection and counter circuit 750. At this point, the NSEL[N:0] value for falling edge transitions is set. NSEL values may similarly be provided to both interpolators 705 and 710 and gated as described above such that the NSEL values of only one interpolator are adjusted.

Once the desired calibration operation(s) have been completed, I/O self-testing may be initiated in response to the calibrate enable signal being deasserted. This may be referred to as an interpolation phase in contrast to the calibration phase described above.

Referring to FIGS. 1, 7 and 8, in the interpolation phase, unlike the integrating mixer circuits described above, CSELA and/or CSELB signals are adjusted to vary the phases of the output signals $\phi_A$ and $\phi_B$, respectively, as desired. Therefore, in contrast to the integrating mixer circuit described in reference to FIGS. 2 and 3, there is no mixing of PMOS/NMOS transconductance.

CSELA and/or CSELB signals may be loaded from the test registers 175, the other registers 190, via scan circuitry 170 or in another manner. Where it is desirable to vary CSELA signals, CSELA values may be provided directly to the CSEL decoder 825 instead of to the NAND gate 738. Switching between the calibration settings and interpolation operation may be accomplished using a multiplexer (not shown), for example, that is controlled in response to the calibrate enable signal. For rising edge transitions, the PSEL[N:0] value identified during calibration determines the resistive delay through the respective interpolator while the NSEL[N:0] value identified during calibration determines the resistive delay for falling edge transitions.

Thus, for a given capacitive load at the output of a given interpolator 705 or 710 determined in response to the CSELA and CSELB signals, RC delay is linearly proportional to 1/(number of PSEL or NSEL bits that are turned on). It will be noted that "turned on" in the exemplary embodiments of FIGS. 7 and 8 refers to a logic high value for PSEL bits and a logic low value for NSEL bits. Any value $\phi_{X(n)}$ for this embodiment can be calculated as $\phi_{X(n)} = \Phi_{X(0)} + \theta/(16 \star \text{Cload}) \star [\text{Co} + \text{CSELx}(n) \star \text{Cload}]$.

The output characteristics for the direct RC-delay switching interpolators 705 and 710 are similar to those of the integrating mixer circuits shown in FIG. 6.

Results of such testing may be stored in an on-chip memory such as the registers 175 and/or 190 or may be provided to an external tester (not shown) via a test access port that is part of the scan circuitry 170.

Figure 9:
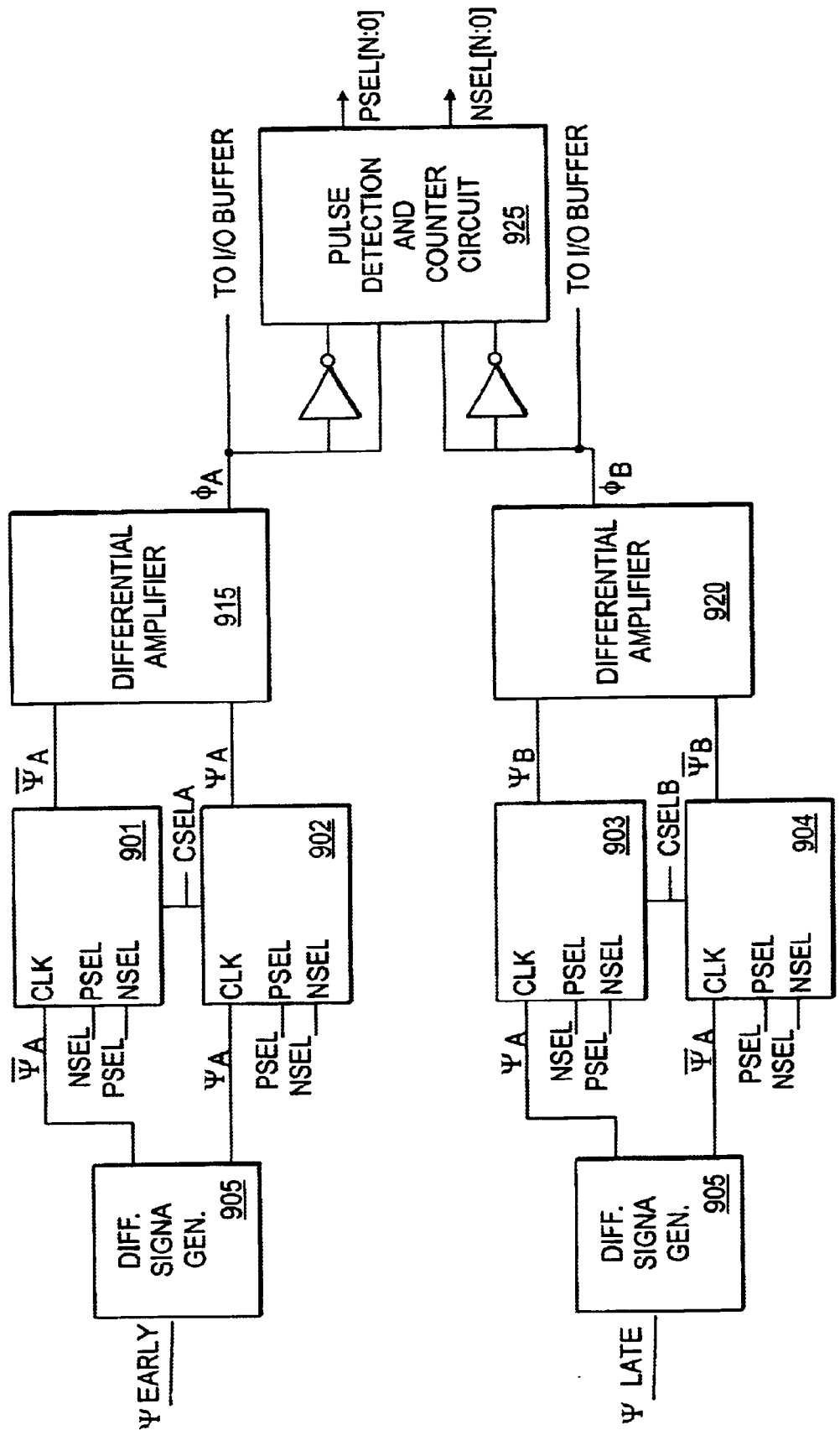
FIG. 9 is a block diagram showing an exemplary differential signaling arrangement using the direct RC-delay switching interpolator of one embodiment.

For the embodiments described above, a single-ended signaling approach is shown for purposes of example. It will be appreciated, however, that the interpolators of various embodiments may also be used in a differential signaling environment. FIG. 9, for example, shows a block diagram of a differential signaling implementation using interpolators 901–904, each of which is similar in configuration and operation to the direct RC-delay switching interpolators of FIGS. 7 and 8.

Differential signal generators 905 and 910 provide differential signals $\psi_A$ and $\psi_A'$ and differential signals $\psi_B$ and $\psi_B'$, respectively, in response to receiving input signals $\psi_{EARLY}$ and $\psi_{LATE}$. These differential signals $\psi_A$ and $\psi_A'$ and $\psi_B$ and $\psi_B'$ are provided to the interpolators 901–904 in the manner shown in FIG. 9.

Also, as shown in FIG. 9, the direct RC-delay switching interpolators 902 and 903 receive PSEL[N:0] and NSEL[N:0] signals at PSEL[N:0] and NSEL[N:0] inputs, respectively. For the interpolators 901 and 904, however, these input signals are cross-coupled such that the PSEL[N:0] inputs receive NSEL[N:0] signals while the NSEL[N:0] inputs receive PSEL[N:0] signals. Further, the CSELA[M:0] settings for interpolators 901 and 902 are the same as are the CSELB[M:0] settings for interpolators 903 and 904. In this manner, transition times of complementary signals $\psi_A$ and $\psi_A'$ at outputs of the interpolators 902 and 901 substantially match each other as do transition times of complementary signals $\psi_B$ and $\psi_B'$ at outputs of interpolators 903 and 904.

Complementary signals $\psi_A$ and $\psi_A'$ are provided to a differential amplifier 915 while complementary signals $\psi_B$ and $\psi_B'$ are provided to a differential amplifier 920. Each of the differential amplifiers 915 and 920 then provides a corresponding single-ended output signal $\phi_A$ and $\phi_B$, respectively. The $\phi_A$ and $\phi_B$ signals are then used as described previously to, for example, clock associated I/O buffer latches. For the calibration operation, the $\phi_A$ and $\phi_B$ signals are provided to phase detection and counter circuits 925 in the manner shown in FIG. 7.

It will be appreciated that the integrating mixer circuits discussed above may also be used in a differential signaling implementation.

While exemplary interpolators have been described herein as being used for I/O self-test applications, other applications and implementations are within the scope of various embodiments.

Figure 10:
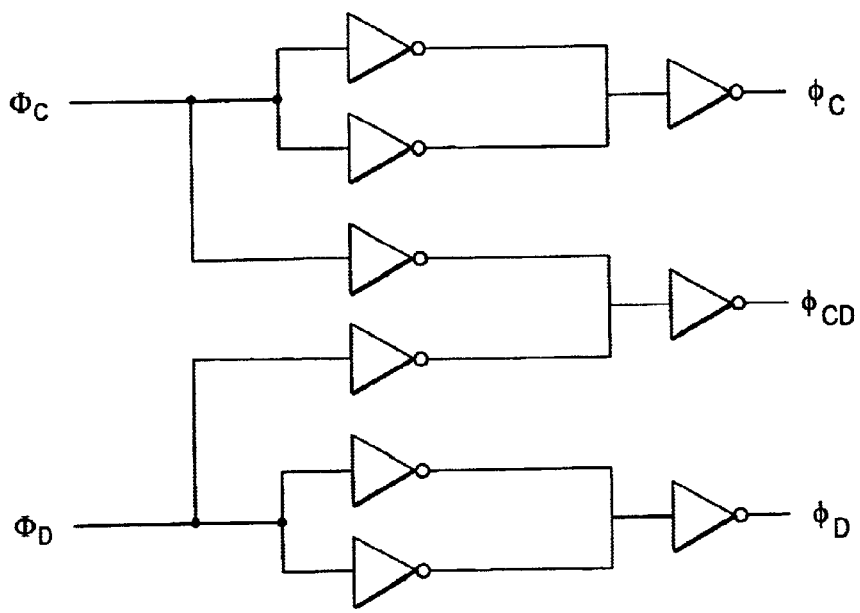
FIG. 10 is a schematic diagram of a first prior signal interpolator circuit.
Figure 11:
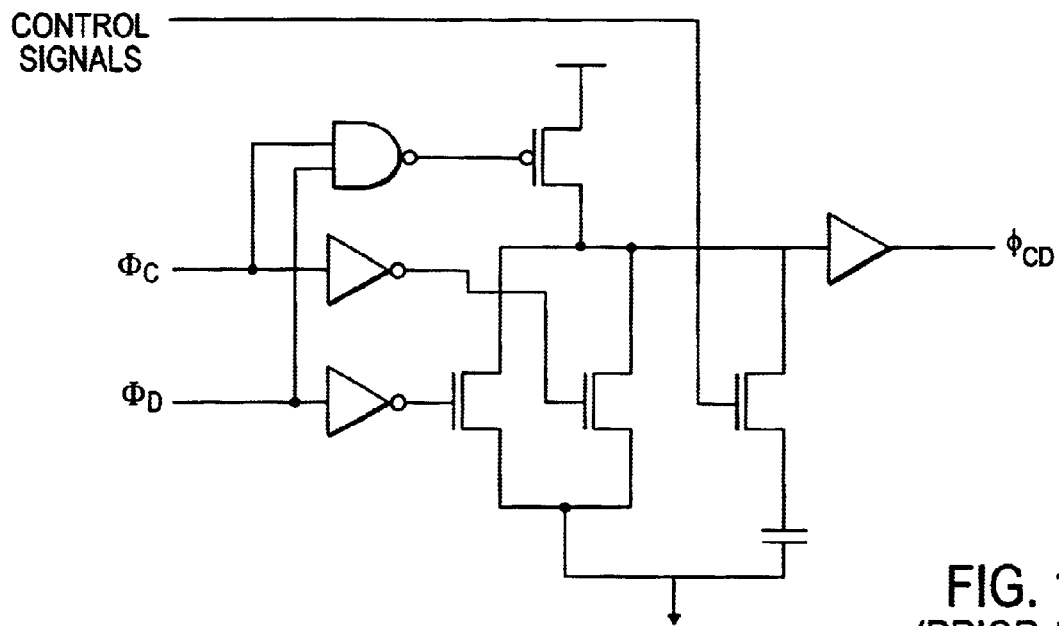
FIG. 11 is a schematic diagram of a second prior signal interpolator circuit.

Using interpolators in accordance with embodiments of the inventions, by reducing the number of cascading paths as compared to an interpolator such as that shown in FIG. 10, jitter may be significantly reduced. Further, it may be more straightforward to achieve a symmetric duty cycle as compared to an interpolator such as the one shown in FIG. 11. Additionally, as described above, process, voltage and/or temperature variations can be compensated for with the described calibration approaches.

The circuitry used in the interpolators of various embodiments is relatively simple such that the physical implementation of the circuitry may be easier and more robust as compared to conventional interpolators. The relatively simple and area-efficient implementations of some embodiments makes them cost effective for self-test applications that may only be activated during manufacturing test, for example.

Figure 12:
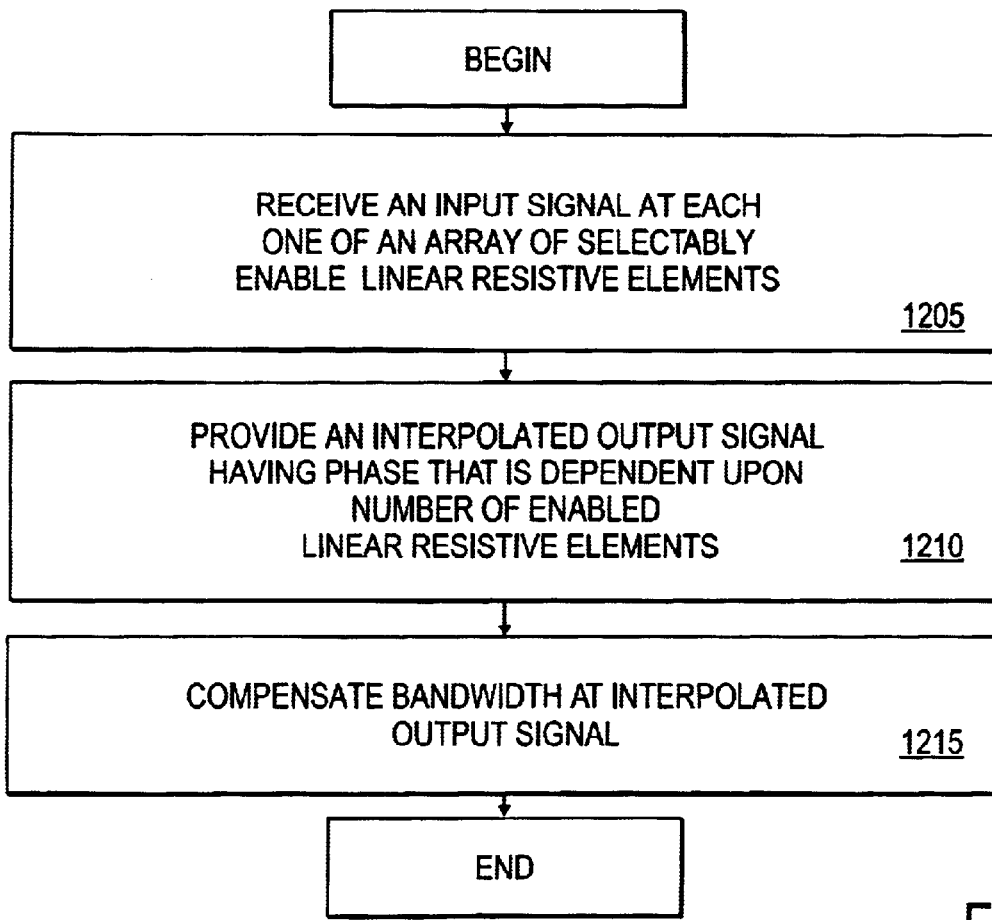
FIG. 12 is a flow diagram showing a signal interpolation method of one embodiment.

Referring to FIG. 12, a method of one embodiment for precise signal interpolation is described. At processing block 1205, an input signal is received at each one of an array of selectably enableable linear resistive elements. At processing block 1210 an interpolated output signal having a phase that is dependent upon a number of linear resistive elements that are selectively enabled is provide, and at processing block 1215, the bandwidth of the interpolated output signal is compensated.

It will be appreciated that, for other embodiments, additional actions may be included.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A circuit comprising:

a first array of selectable linear resistive elements, each of the linear resistive elements in the first array to receive a first input signal, each of the linear resistive elements in the first array having an output coupled to a first output signal line;

a variable bandwidth-compensating circuit coupled to the first output signal line to compensate the bandwidth of a first output signal on the first output signal line, the variable bandwidth-compensating circuit including a first number of selectably enableable, parallel-coupled capacitive elements;

a second array of selectable linear resistive elements, each of the linear resistive elements in the second array to receive a second input signal, the second input signal being out of phase with the first input signal, each of the linear resistive elements in the second array having an output coupled to the first output signal line, the first output signal on the first output signal line being an interpolated output signal; and a phase detection circuit to receive the first output signal and a second output signal, the phase detection circuit to provide a select signal responsive to a phase difference between the first and second output signals, the select signal to determine a number of capacitive elements to be enabled in the variable bandwidth-compensating circuit.

2. A circuit comprising:

an upper barrel including a first plurality of selectably enableable current sources, the upper barrel to receive a first input signal;

a lower barrel including a second plurality of selectably enableable current sources, the lower barrel to receive a second input signal;

a mixing node coupled to mix an output of the upper barrel with an output of the lower barrel to provide a mixed signal; and a configurable capacitive load coupled to modulate the mixed signal to provide an output signal having a phase that is dependent upon the number of selectably enableable current sources that are enabled in each of the upper and lower barrels.

3. The circuit of claim 2 wherein at least one of the selectably enableable current sources comprises one of a totem-pole, source-coupled inverter, an active linear resistive element and a passive linear resistive element.

4. The circuit of claim 3 wherein each of the selectably enableable current sources in the upper barrel further comprises two select inputs, a first select input to receive a first select signal to select a pull-up path in the respective current source, a second select input to receive a second select signal to select a pull-down path in the respective current source, each of the pull-up paths and pull-down paths in the current sources of the upper barrel further being responsive to a value of the first input signal, and wherein each of the selectably enableable current sources in the lower barrel further comprises two select inputs, a first select input to receive a complement of the first select signal to select a pull-up path in the respective current source, a second select input to receive a complement of the second select signal to select a pull-down path in the respective current source, each of the pull-up paths and pull-down paths in the current sources of the lower barrel further being responsive to a value of the second input signal.

5. The circuit of claim 3 wherein the capacitive load comprises an array of selectable, parallel-coupled capacitive elements, the circuit further comprising a phase detector circuit, an output of the phase detector circuit to determine a number of capacitive elements in the capacitive load to be enabled.

6. A circuit comprising:

an array of gates, each of the gates including a totem-pole, source-coupled inverter, each of the gates having inputs to receive a periodic input signal and first and second select signals and an output coupled to a first output signal line; and an array of capacitive elements to receive a third select signal, a value of the third select signal to determine a number of the capacitive elements to be coupled to the first output signal line.

7. The circuit of claim 6 further comprising first and second phase detectors, each of the first and second phase detectors having an input coupled to the first output signal line and an output, an output of the first phase detector to provide the first select signal, and an output of the second phase detector to provide the second select signal.

8. A method comprising:

receiving an input signal at each one of an array of selectably enableable linear resistive elements;

providing an interpolated output signal having a phase that is dependent upon a number of linear resistive elements that are selectively enabled;

compensating the bandwidth of the interpolated output signal; and performing a calibration operation to determine a capacitance of a circuit used to compensate the bandwidth of the interpolated output signal.

9. The method of claim 8 further comprising:

adjusting a phase of the interpolated output signal by changing a number of linear resistive element that are enabled.

10. The method of claim 9 further comprising:

enabling pull-up and pull-down paths concurrently, wherein the phase of the interpolated output signal is determined by the relative transconductance of the pull-up path with respect to the pull-down path.

11. A method comprising:

selectively enabling a first number of linear resistive elements in an array of linear resistive elements, each of the linear resistive elements to receive a periodic input signal;

selectively coupling a second number of capacitive elements to an output line;

providing an output signal, a phase of the output signal being responsive to the second number of capacitive elements coupled to the output line; and performing a calibration operation to determine the first number of linear resistive elements to be selectively enabled.

* * * * *

UNITED STATES PATENT AND TRADEMARK OFFICE
CERTIFICATE OF CORRECTION

PATENT NO. : 6,650,159 B2
DATED : November, 18, 2003
INVENTOR(S) : Wang et al.

It is certified that error appears in the above-identified patent and that said Letters Patent is hereby corrected as shown below:

Column 7,
Line 67, delete "(CVBCC)" and insert -- ($C_{VBCC}$) --.

Column 8,
Line 32, delete "MPA" and insert -- $\varphi_A$ --.

Column 9,
Line 10, delete "PSEL[N:0]'. $\phi_A$" and insert -- PSEL[N:0]. $\phi_A$ --.

Column 11,
Line 12, delete "705,for testing," and insert -- 705 for testing, --.

Signed and Sealed this

Fifth Day of October, 2004

JON W. DUDAS
*Director of the United States Patent and Trademark Office*